(12) United States Patent
Jefferies

(10) Patent No.: US 8,854,032 B2
(45) Date of Patent: Oct. 7, 2014

(54) SYSTEM AND METHOD FOR MONITORING CURRENT DRAWN BY A PROTECTED LOAD IN A SELF-POWERED ELECTRONIC PROTECTION DEVICE

(75) Inventor: Kevin Jefferies, Raleigh, NC (US)

(73) Assignee: Schneider Electric USA, Inc., Palatine, IL (US)

(*) Notice: Subject to any disclaimer, the term of this patent is extended or adjusted under 35 U.S.C. 154(b) by 579 days.

(21) Appl. No.: 13/005,221

(22) Filed: Jan. 12, 2011

(65) Prior Publication Data

US 2012/0176120 A1  Jul. 12, 2012

(51) Int. Cl.
*G01R 19/22* (2006.01)
*H02H 3/08* (2006.01)
*G01R 15/18* (2006.01)
*H02H 1/06* (2006.01)

(52) U.S. Cl.
CPC .............. *G01R 15/183* (2013.01); *H02H 3/083* (2013.01); *H02H 1/063* (2013.01)
USPC ......................................................... 324/119

(58) Field of Classification Search
USPC ......................................................... 324/124
See application file for complete search history.

(56) References Cited

U.S. PATENT DOCUMENTS

| | | | | |
|---|---|---|---|---|
| 3,973,171 A | * | 8/1976 | Howell | 361/45 |
| 4,271,447 A | * | 6/1981 | Howell | 361/93.7 |
| 4,703,389 A | * | 10/1987 | Scott | 361/93.3 |
| 4,788,620 A | * | 11/1988 | Scott | 361/96 |
| 5,136,457 A | | 8/1992 | Durivage, III | |
| 5,315,527 A | * | 5/1994 | Beckwith | 702/72 |
| 5,331,501 A | * | 7/1994 | Shimp | 361/94 |
| 5,422,778 A | * | 6/1995 | Good et al. | 361/92 |
| 5,452,172 A | * | 9/1995 | Lane et al. | 361/71 |
| 5,455,549 A | * | 10/1995 | Strickland et al. | 335/17 |
| 5,570,262 A | * | 10/1996 | Doerwald | 361/99 |
| 5,633,774 A | * | 5/1997 | Robertson et al. | 361/93.1 |
| 5,850,330 A | * | 12/1998 | Perron et al. | 361/103 |
| 6,018,700 A | * | 1/2000 | Edel | 702/60 |

(Continued)

FOREIGN PATENT DOCUMENTS

| | | |
|---|---|---|
| EP | 0580285 | 1/1994 |
| EP | 0590937 | 4/1994 |
| EP | 2169798 | 3/2010 |

OTHER PUBLICATIONS

International Search Report for International Application No. PCT/US2012/020583, dated May 4, 2012, 4 pages.

(Continued)

*Primary Examiner* — Patrick Assouad
*Assistant Examiner* — Demetrius Pretlow
(74) *Attorney, Agent, or Firm* — Locke Lord LLP

(57) ABSTRACT

A circuit for measuring current drawn by a self-powered electronic protection device. The circuit monitors current in a polyphase alternating current (AC) power source by measuring current in a rectified secondary winding of a current transformer coupled to a phase current of the power source. The measurement circuit includes a measurement burden connected between the cathode of the current transformer rectifier and a switch. Closing the switch references the voltage drop across the measurement burden to a reference potential. A controller closes the switch while receiving measurements of the voltage drop. Because the voltage drop is referenced to a reference potential, it can be analyzed in a controller to detect a fault condition without being conditioned with an inverting amplifier or a difference amplifier.

20 Claims, 4 Drawing Sheets

(56) References Cited

U.S. PATENT DOCUMENTS

| | | | |
|---|---|---|---|
| 6,604,055 B1 | 8/2003 | Burkett et al. | |
| 7,193,827 B2* | 3/2007 | Reid et al. | 361/42 |
| 7,683,586 B2* | 3/2010 | Davison et al. | 320/166 |
| 7,869,169 B2* | 1/2011 | Davison et al. | 361/42 |
| 7,907,375 B2* | 3/2011 | Blakely et al. | 361/87 |
| 8,054,593 B2* | 11/2011 | Reid et al. | 361/42 |
| 2003/0137309 A1 | 7/2003 | Itimura et al. | |
| 2005/0135032 A1* | 6/2005 | Faulkner et al. | 361/90 |
| 2006/0265157 A1* | 11/2006 | Trivette et al. | 702/64 |
| 2008/0012667 A1* | 1/2008 | Colsch et al. | 335/18 |
| 2008/0048624 A1* | 2/2008 | Davison et al. | 320/166 |
| 2008/0215278 A1* | 9/2008 | Colsch et al. | 702/85 |
| 2009/0027817 A1 | 1/2009 | Kamiyama et al. | |
| 2010/0027176 A1* | 2/2010 | Kawate et al. | 361/86 |
| 2010/0079922 A1 | 4/2010 | Blakely et al. | |
| 2010/0085036 A1* | 4/2010 | Banting et al. | 324/127 |
| 2010/0239030 A1* | 9/2010 | Fukahori et al. | 375/258 |
| 2011/0057662 A1 | 3/2011 | Eriksson et al. | |

OTHER PUBLICATIONS

Written Opinion for International Application No. PCT/US2012/020583, dated May 4, 2012, 8 pages.

* cited by examiner

US 8,854,032 B2

SYSTEM AND METHOD FOR MONITORING CURRENT DRAWN BY A PROTECTED LOAD IN A SELF-POWERED ELECTRONIC PROTECTION DEVICE

FIELD OF THE INVENTION

The present disclosure relates generally to electronic protection devices, and, more particularly, to a configuration for taking measurements in a self-powered electronic protection device.

BACKGROUND

Loads connected to electrical circuits can be damaged if the loads draw more current than they are configured to tolerate. For example, inductive motor loads that draw too much current from a power source can suffer from overheating, which degrades the motor life and can potentially break down the insulation in the motor windings. Additionally three-phase inductive motor loads configured to receive power from a three-phase AC power source can be damaged if the power source suffers from a phase loss or phase imbalance. A phase loss occurs when one phase of the current delivered by a polyphase power source is disconnected. A phase loss fault can occur due to a blown fuse or a discontinuous power wire in series with the conductor carrying the phase. A phase imbalance fault occurs when one or more of the phases of the current drop below some characteristic fraction of their nominal values. A phase loss fault and a phase imbalance fault can degrade the motor load by causing the motor windings to draw current unevenly and heat unevenly, which is inefficient and degrades the life of the motor and potentially overheats the insulation of the motor windings.

An electronic protection device can protect a load from fault events by monitoring the current drawn by the load and disconnecting the load from its power source upon detecting a fault event. The electronic protection device can also be self-powered, that is, the device can be powered from the same current that the device monitors. Self-powered electronic protection devices are conventionally powered from a rectified secondary winding of a current transformer (CT), with the monitored current sent through a primary winding of the CT. Conventional electronic protection devices monitor the current drawn by the load by measuring current returning to an anode of the rectifier connected to the CT secondary. This approach for measuring the current requires an inverting amplifier or a difference amplifier to condition the measurement signal for analysis within the device.

However, an inverting amplifier or difference amplifier incurs additional cost and current consumption. As a result of current consumption and cost constraints, many conventional electronic protection devices incorporate only one inverting amplifier and provide a measurement signal representative of the sum of rectified currents from all phases of a polyphase power source. Such a conventional configuration cannot measure each phase current directly without incurring additional cost and current consumption penalties by adding additional inverting amplifiers to condition the additional phases. Detection of phase loss or phase imbalance faults is improved by measuring each phase current directly for analysis within the electronic protection device. So, conventional electronic protection devices are forced to compromise between cost and current consumption on one hand, and sensitivity and performance of the device on the other.

BRIEF SUMMARY

Provided herein is a measurement circuit for separately measuring electrical characteristics associated with all three phase currents of a three-phase power source in an electronic protection device without using an inverting amplifier or difference amplifier. The electronic protection device can be a self-powered solid state overload relay providing protective functions to a load connected to the power source. The electronic protection device is configured to monitor electrical characteristics associated with the load to determine whether to activate a trip mechanism, which causes the load to disconnect from the power source by, for example, causing a contactor to disconnect the load from the power source. Aspects of the present disclosure provide a circuit for measuring the monitored electrical characteristic, such as the current drawn by the load. The electronic protection device is self-powered from a phase or phases of the monitored current through a rectified secondary winding of a current transformer. Each monitored phase current can be connected to a rectified secondary winding.

The measurement circuit includes a measurement burden for each phase current monitored by the electronic protection device. The measurement burden is connected between the cathode of the rectifier and a switch. The switch can be closed to reference the measurement burden to a reference potential and thereby provide a properly referenced output signal for analysis in a controller. The output signal can be a voltage drop across the measurement burden, or across a portion of the measurement burden, and can be indicative of the current flowing through the secondary winding of the current transformer connected to the rectifier for each phase. Aspects of the present disclosure provide that the output signal does not need to be conditioned by an inverting amplifier or difference amplifier before being analyzed in a controller, because the measurement burden is connected to the cathode side, or the high side, of the rectifier, and because the measurement burden is referenced to the reference potential during measurements of the voltage drop across the measurement burden. Aspects of the present disclosure provide for separately measuring all three phases of a three-phase power source without incurring the cost and current consumption penalty required by an inverting amplifier.

The foregoing and additional aspects and implementations of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

DETAILED DESCRIPTION

Figure 1A:
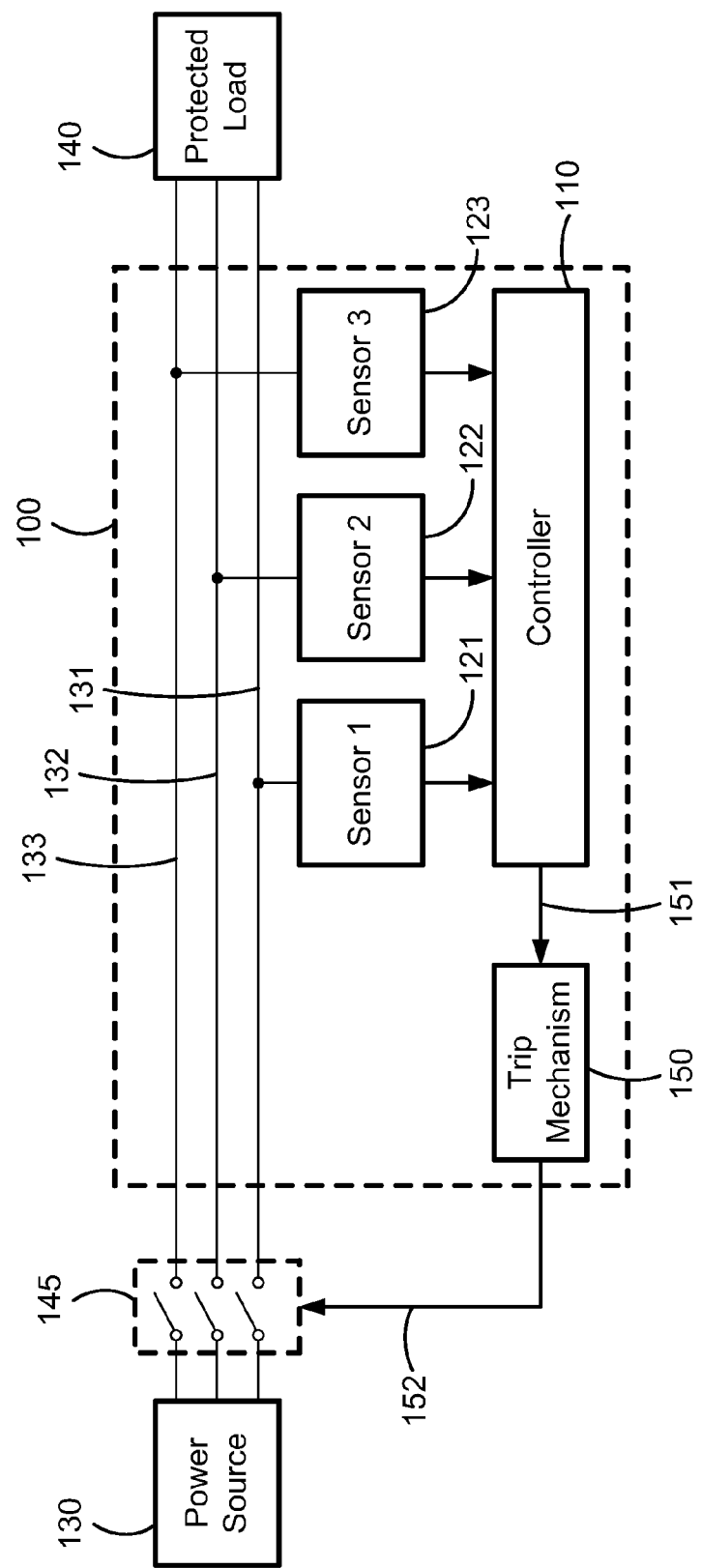
FIG. 1A is a block diagram of an electronic protection device configured to provide protective functions to a protected load connected to a power source.

FIG. 1A is a block diagram of an electronic protection device 100 configured to provide protective functions to a protected load 140 connected to a power source 130. The power source 130 can be a polyphase alternating current (AC) power source. The power source 130 can include three conductive lines 131, 132, 133 for providing three phases of a supply current, and can be arranged according to a delta or wye configuration. In a configuration, the protected load 140 can be an inductive motor load. The electronic protection device 100 includes a first sensor 121, a second sensor 122, a third sensor 123, a controller 110, and a trip mechanism 150. The trip mechanism 150 is configured to receive a trip signal 151 from the controller 110. The three sensors 121, 122, 123 can be configured to provide outputs indicative of an electrical characteristic monitored by the three sensors 121, 122, 123 to the controller 110. For example, the monitored electrical characteristic can be a current flowing through one or more of the three conductive lines 131, 132, 133 (e.g., electrical conductors) or a voltage between one or more of the three conductive lines and each other or a reference potential.

In a configuration of the electronic protection device 100, the first sensor 121 is connected to a first conductive line 131 of the power source 130 carrying a first phase of the supplied current. The first sensor 121 can, for example, be a current sensor for monitoring the current drawn by the protected load 140 from the first phase of the supplied current. The second sensor 122 is connected to a second conductive line 132 of the power source 130 carrying a second phase of the supplied current. The second sensor 122 can, for example, be a current sensor for monitoring the current drawn by the protected load 140 from the second phase of the supplied current. The third sensor 123 is connected to a third conductive line 133 of the power source 130 carrying a third phase of the supplied current. The third sensor 123 can, for example, be a current sensor for monitoring the current drawn by the protected load 140 from a third phase of the supplied current. The controller 110 receives the outputs of the three sensors 121, 122, 123. While the power source 130 is illustrated having three conductors carrying three phases of a supply current, the present disclosure applies to implementations having polyphase power sources with supply currents having more than three or fewer than three phases, such as a single phase power source.

The controller 110 is connected to the trip mechanism 150 and is configured to actuate the trip mechanism 150 responsive to detecting a fault event. Actuating the trip mechanism 150 disconnects the protected load from the power source 130 by activating a contactor 145. The contactor 145 is symbolically illustrated in the block diagram shown in FIG. 1 as a set of three switches operable according to a control signal 152 from the trip mechanism 150, however the present disclosure is not limited to a contactor 145 including a switch. The contactor 145 can be a mechanical or electromechanical apparatus suitable for disconnecting the power source 130 from the load 140 according to the control signal 152. Similarly, the trip mechanism 150 can be a mechanical or electromechanical apparatus suitable for communicating the control signal 152 to the contactor 145 according to signals received from the controller 110, such as the trip signal 151. In an implementation, the control signal 152 communicated to the contactor 145 can be a steady current or voltage that operates to maintain the switches of the contactor 145 in a closed position and thereby maintain the connection between the power source 130 and the protected load 140. For example, the control signal 152 can be a bias applied to a transistor within the contactor 145, and the interruption of the control signal 152 can cause the transistor to be turned off, which can cease to maintain the contactor 145 in the closed position. The contactor 145 can be configured to open its switches and thereby disconnect the protected load 130 from the power source 140 when the steady current or voltage received from the trip mechanism 150 is interrupted.

In an implementation of the present disclosure, the trip mechanism 150 can be actuated by sending current through an actuator coil. The current can be sent through the actuator coil by discharging an energy storage by biasing a transistor to complete a circuit including the energy storage and the actuator coil. The actuator coil can be a portion of a solenoid, and the mechanical movement due to actuation of the solenoid can cause a mechanical lever, rod, linkage, or rotating element to open electrical contacts in the trip mechanism 150, either directly or indirectly. Opening the electrical contacts in the trip mechanism 150 can cause the control signal 152 to be interrupted and thereby cause the contactor 145 to disconnect the protected load 140 from the power supply 130. The contactor 145 can operate to disconnect all phases of the power supply 130 from the protected load 140 simultaneously.

The controller 110 can be a microcontroller, an application specific integrated circuit (ASIC), a field programmable gate array (FPGA), or another electronic device suitable for receiving signals indicative of an electrical characteristic (e.g., current or voltage) of the power source 130. The controller 110 can analyze the received signals to determine whether a fault condition has occurred, and cause the trip mechanism 150 to actuate in response to determining whether the fault condition occurred by, for example, issuing the trip signal 151. In an implementation of the electronic protection device 100, one or more of the three sensors 121, 122, 123 can be incorporated into the controller 110. For example, the controller 110 can include three inputs configured to receive voltages proportional to a current carried by the three conductive lines 131, 132, 133, and the voltages can be generated by measuring voltage drops across measurement burdens (e.g., resistors) for each of the conductive lines 131, 132, 133.

The measurements can be analyzed in the controller 110 according to techniques available in power system analysis and digital signal processing to detect a fault condition of the current supplied by the power source 130. For example, one or more of the measurements exceeding a thermal threshold value for a time duration can indicate an over-current fault event or a thermal fault event. The thermal threshold value can be based on an aspect or feature of the protected load 140, on a nominal value of the monitored electrical characteristic, or on a user input. The nominal value of the monitored electrical characteristics can be based on, for example, an average or median value of the electrical characteristic. The measurements signals can also be compared to one another and to the nominal values for the measurements to detect fault conditions other than thermal faults. In an example implementation, a thermal fault can be indicated by a measurement of current for a phase of the supplied current exceeding 200% of the nominal current value for the phase and lasting for a duration of eight minutes, as specified in Underwriter's Laboratory standard 508 (UL 508). The detection of faults in the controller 110 can be implemented using an accumulator or an integrator to measure an amount of received current over a time duration and to detect a fault when a running accumulation of current over time exceeds a threshold value.

The measurements can be compared with one another to detect a phase imbalance fault condition. A phase imbalance can be determined to occur when the comparison between multiple phases indicates that one or more of the phases of the supplied current are not in a tolerance range. The tolerance range can be based on an aspect or feature of the protected load 140, on a nominal value of the monitored electrical characteristic, or on a user input. A phase imbalance fault can also be indicated by one or more of the phases falling below its nominal value by a percentage, which can be, for example, 60% of the nominal value for the monitored phase. A phase loss fault can be detected by determining whether one or more of the phase currents is below a loss threshold, which can be a threshold corresponding to current near zero in an implementation. Furthermore, in an implementation, fault detection and discrimination can be based on trends in the measurements over time, on comparisons between multiple phases of the supplied current, and on comparisons between the phases and one or more threshold values that can optionally be dynamically determined. Fault detection and discrimination can be based on measurements indicative of current or voltage in the conductive lines 131, 132, 133.

In an example operation of the electronic protection device 100, the power source 130 energizes the conductive lines 131, 132, 133 and one or more electrical characteristics of the power (e.g., current or voltage) delivered to the protected load 140 are detected using the three sensors 121, 122, 123. The controller 110 analyzes the electrical characteristic(s) monitored by the three sensors 121, 122, 123 and determines whether a fault event has occurred. Responsive to determining that a fault event has occurred, the controller 110 causes the trip mechanism 150 to actuate using the trip signal 151.

In an implementation, the electronic protection device 100 can be self-powered, meaning that the electronic components of the electronic protection device 100 are powered by the same current or voltage that the electronic protection device 100 is monitoring. In other words, by self-powered, it is meant that the electronic protection device 100 does not have an independent power supply, but rather derives its power from the conductive line or lines 131, 132, 133 it is monitoring. In a configuration of the electronic protection device 100 incorporating aspects powered from direct current (DC) power, such as digital logic aspects or solid-state aspects, the electronic protection device 100 can be self-powered. One or more of the conductive lines 131, 132, 133 of the power source 130 can be connected to a primary winding of a current transformer (CT), and a secondary winding of the CT can be connected to a rectifier to supply DC power to the electronic protection device. A configuration where power is provided to the electronic protection device 100 from the same conductive line of the power source being monitored by the electronic protection device 100 is a self-powered configuration. Generally, self-powered devices do not draw power once the electronic protection device 100 is tripped, which can cause current flow through the current rectifier to halt, either directly or indirectly.

The electronic protection device 100 can be configured as an overload relay. The overload relay can be configured to monitor current drawn by the protected load 140 and to disconnect the protected load 140 when the monitored current indicates that a fault condition has occurred. The overload relay can be a solid state overload relay incorporating intelligent electronic elements having memory and logical circuitry.

Figure 1B:
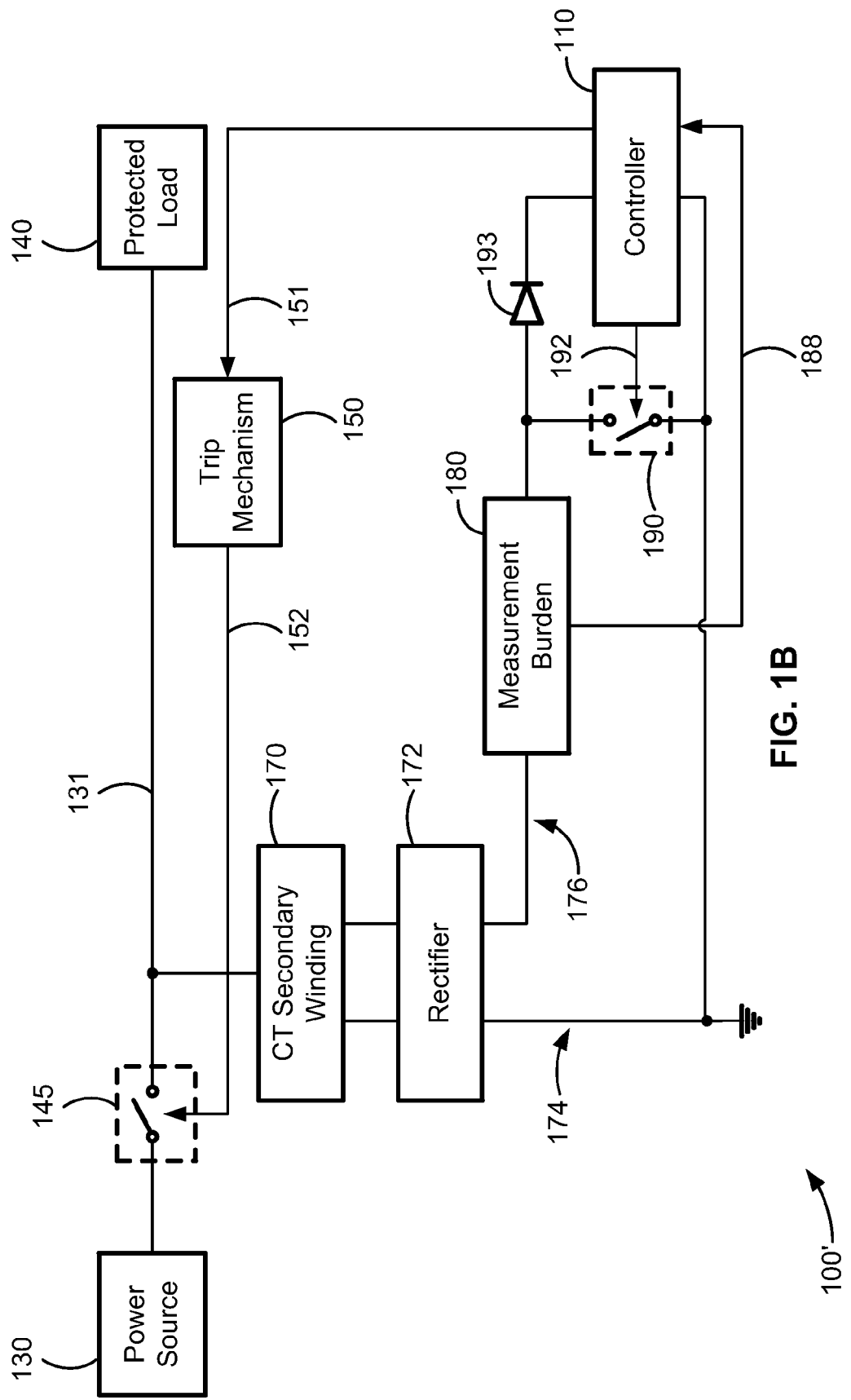
FIG. 1B is a block diagram of a self-powered electronic protection device.

FIG. 1B is a block diagram of a self-powered electronic protection device 100'. For clarity, the self-powered electronic protection device 100' is illustrated with a connection to the first conductive line 131 carrying the first phase of supplied current from the power source 130. However, in an implementation, the self-powered electronic protection device 100' can include connections to multiple conductive lines (such as the lines 132, 133 shown in FIG. 1A) carrying multiple phases of the current supplied by the power source 130. The self-powered electronic protection device 100' includes a current transformer (CT) secondary winding 170. The current carried by the first conductive line 131 can be configured to flow through a primary winding of the CT, such that the current in the CT secondary winding 170 is proportional to the current flowing through the first conductive line 131. The CT secondary winding has a first and second output connected to a rectifier 172. The rectifier 172 rectifies the alternating current from the CT secondary winding 170 to provide a direct current (DC) power source to the remaining electronic components within the self-powered electronic protection device 100'. The rectifier 172 has a cathode 176 and an anode 174 and provides DC current flowing from the cathode 176 to the anode 174. In an implementation, the anode 174 can be connected to a reference potential, which can optionally be a ground potential. In a configuration, the rectifier 172 can be implemented as a bridge rectifier.

The self-powered electronic protection device 100' further includes a measurement burden 180 connected to the cathode 176. The measurement burden 176 can generate a voltage drop proportional to the current flowing through the first conductive line 131. The measurement burden 180 provides a measurement output 188 for providing a measurement signal to the controller 110. The measurement output 188 can be a conductive wire for conducting a voltage due to the voltage drop across the measurement burden 180 to a measurement input of the controller 110. In an implementation of the present disclosure, the measurement burden 180 can be a resistor and the measurement output 188 can be connected to a side of the measurement burden 180 nearest the cathode 176.

The self-powered electronic protection device 100' further includes a switch 190 for referencing the measurement burden to the reference potential. The switch 190 is configured to operate according to a switch signal 192 issued by the controller 110. For example, the switch 190 can be a transistor having a gate terminal for receiving the switch signal 192. The transistor can have a drain terminal and a source terminal connected to the measurement burden and the reference potential, respectively. In an implementation of the present disclosure, the controller 110 is configured to close the switch 190 whenever the controller 110 reads a measurement from the measurement output 188. According to an aspect of the present disclosure, closing the switch 190 during measurements of the measurement burden 180 references the voltage drop generated across the measurement burden 180 to the reference potential. According to an aspect, referencing the measurement burden 180 to the reference potential ensures that the measurement signal communicated to the controller 110 through the measurement output 188 is properly referenced to the reference potential of the controller 110 without requiring additional conditioning by an inverting amplifier or a difference amplifier. According to an aspect, properly referencing the voltage drop across the measurement burden 180 by closing the switch 190 ensures that the voltage drop is in a range of voltages that can be interpreted by an analog-to-digital converter within the controller 110. Furthermore, closing the switch 190 can ensure that the voltage drop is in a range of voltages that advantageously correspond to the sensitive range of the analog-to-digital converter.

In an implementation of the self-powered electronic protection device 100', the switch 190 can also be used to regulate the DC power supplied to the controller 110 and to any other electronic components of the self-powered electronic protection device 100' requiring a DC power source. The switch 190 can be used to regulate the DC power supply by periodically redirecting the DC power to bypass the controller 110 and associated electronic components by closing the switch 190. Closing the switch 190 causes DC current to flow back to the anode of the rectifier 174 and bypass the controller 110 and associated electronic components. The controller 110 can be configured to periodically close and open the switch 190 by issuing the switch signal 192 to provide a desired DC power supply to the controller 110 and associated electronic components. The rate and duration of the closings of the switch 190 can be determined based on the measurement signal carried by the measurement output 188 from the measurement burden 180. The measurement signal can be a signal indicative of the voltage drop across the measurement burden 180. The self-powered electronic protection device 100' further includes a diode 193 connected between the measurement burden 180 and the controller 110. The diode 193 ensures that DC current does not flow backwards from the controller 110 toward the cathode 176 during times when the switch 190 is closed such that the anode of the diode 193 is connected to the reference potential.

As described above in reference to FIG. 1A, the controller 110 is configured to operate the trip mechanism 150 to cause the protected load 140 to be disconnected from the power source 130 by issuing the trip signal 151. The controller 110 issues the trip signal 151 when the controller 110 detects a fault condition in the current supplied by the power source 131. The fault condition can be detected based on analysis in the controller 110 of the measurement signal provided by the measurement output 188. For example, the controller 110 can be configured to issue the trip signal 151 upon detecting a thermal fault indicated by the measurement signal surpassing a thermal threshold value, or upon detecting a phase loss or phase imbalance fault indicated by a comparison of the measurement signal with its nominal value or with another threshold value. Additionally, and similarly to the description above in connection with FIG. 1A, the controller 110 can detect a fault condition based on trends in the measurement signal over time, or based on comparisons between the measurement signal and measurement signals indicative of electrical characteristics of additional phase currents of the power source 130.

In an example operation of the self-powered electronic protection device 100', the first conductive line 131 is energized which causes current to flow through the CT secondary winding 170. The rectifier 172 receives the AC current from the CT secondary winding 170 and provides DC current flowing from the cathode 176 to the anode 174. The controller 110 issues the switch signal 192 to reference the measurement burden 180 to the reference potential, and the measurement burden 180 generates a voltage drop indicative of the current flowing through the first conductive line 131. The voltage drop is communicated to the controller 110 as the measurement signal is transmitted through the measurement output 188. The controller 110 then determines whether to issue the trip signal 151 based on the received measurement signal. If the controller 110 determines a fault condition has occurred, the trip signal 151 is issued and the trip mechanism 150 is actuated, which causes the protected load 140 to be disconnected from the power source 130 by sending the control signal 152 to the contactor 145.

Figure 1C:
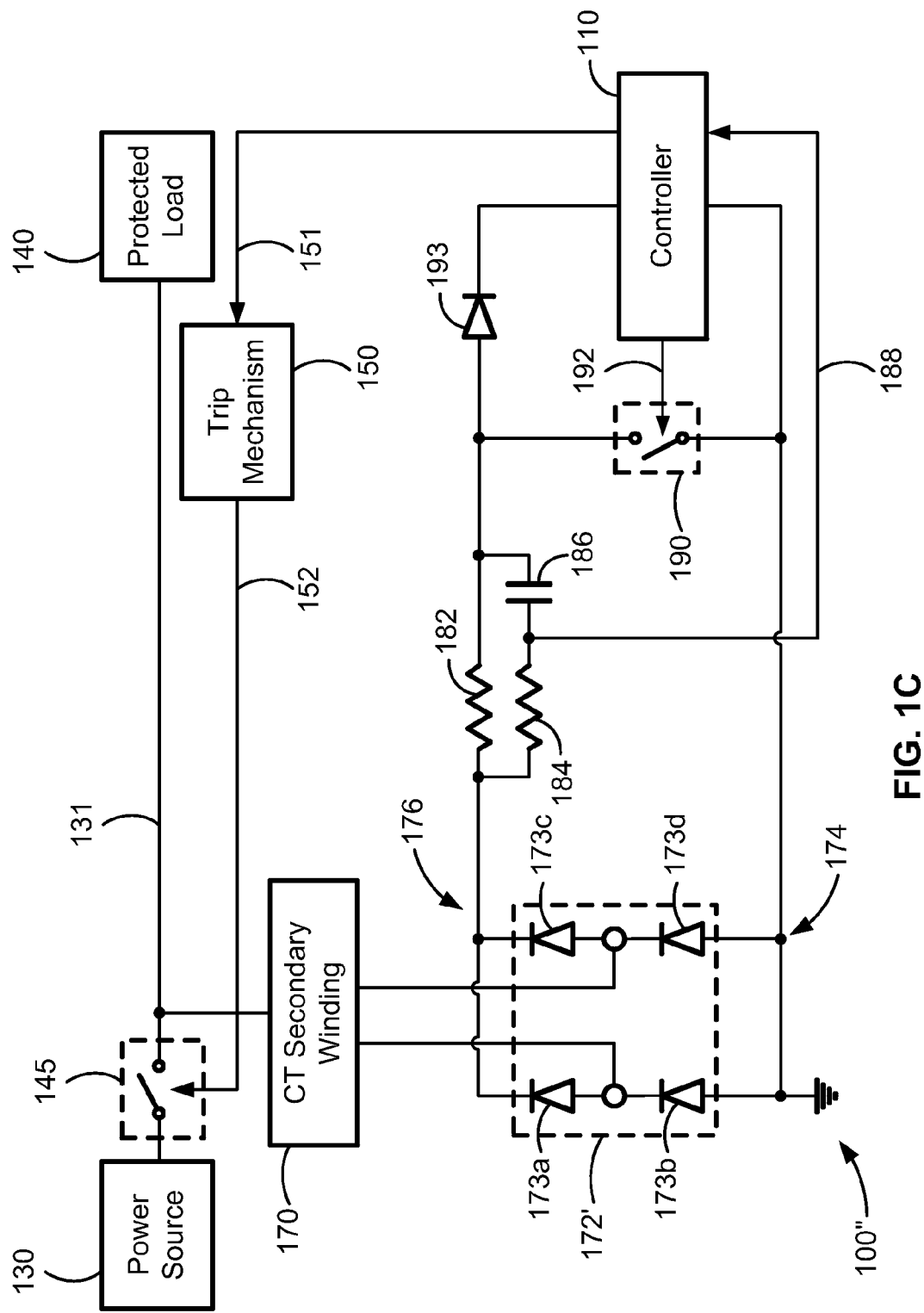
FIG. 1C is a block diagram of a measurement circuit for a self-powered electronic protection device.

FIG. 1C is a block diagram of a measurement circuit 100" for a self-powered electronic protection device. The measurement circuit 100" includes a rectifier 172' configured as a diode bridge rectifier for rectifying AC current from the CT secondary winding 170. The rectifier 172' includes four rectifying diodes 173a, 173b, 173c, 173d. The first output of the CT secondary winding 170 is connected to the anode of the first rectifying diode 173a and the cathode of the second rectifying diode 173b. The second output of the CD secondary winding 170 is connected to the anode of the third rectifying diode 173c and the cathode of the fourth rectifying diode 173d. The cathodes of the first rectifying diode 173a and the third rectifying diode 173c are both connected to the cathode 176, and the anodes of the second rectifying diode 172b and the fourth rectifying diode 172d are both connected to the anode 174. The rectifier 172' provides a DC power source from the CT secondary winding 170 to the controller 110 and associated electronic components.

The measurement circuit 100" further includes a burden resistor 182 connected between the cathode 176 and the switch 190. The burden resistor 182 generates a voltage drop indicative of an electrical characteristic associated with the phase current carried by the first conductive line 131. To minimize effects from short term fluctuations and aliasing, the measurement burden 180 can optionally further include a second resistor 184 and a capacitor 186 configured as a low pass filter of the voltage drop across the burden resistor 182. The second resistor 184 and the capacitor 186 can be connected in series and the burden resistor 182 can be connected in parallel across the series of the second resistor 184 and the capacitor 186. The burden resistor 182 can have a first terminal and a second terminal; the second resistor 184 can have a first terminal and a second terminal; and the capacitor 186 can have a first terminal and a second terminal. The first terminal of the burden resistor 182 can be coupled to the first terminal of the second resistor 184; the second terminal of the second resistor 184 can be coupled to the first terminal of the capacitor 186; and the second terminal of the burden resistor 182 can be coupled to the second terminal of the capacitor 186. The measurement output 188 can be coupled between the second resistor 184 and the capacitor 186.

In an implementation, the configuration of the burden resistor 182, the second resistor 184, and the capacitor 186 can provide the measurement burden 180 shown in FIG. 1B. In an implementation of the present disclosure, the capacitor 186 can be replaced with multiple capacitors as is appreciated in the fields of power systems monitoring and circuit design. Similarly, the first resistor 182 and the second resistor 184 can be replaced with multiple resistors. The values of the resistance of the resistors 182, 184 and the capacitance of the capacitor 186 can be selected according to requirements of the controller 110, the rectifier 172', the protected load 140, the characteristics of the CT secondary winding 170, or according to a user selected input. The values can also be selected based on characteristics of the power source 130 and the CT secondary winding 170 to ensure that the voltage drop generated across the burden resistor 182 corresponds to a range of sensitivity of an analog-to-digital converter within the controller 110.

In an example implementation of the present disclosure where the CT has a 10,000:1 winding ratio between the secondary winding and the primary winding and where the maximum current to be measured through the first conductive line 131 is 100 A, the maximum current through the CT secondary winding 170 is roughly 100 A/10,000=0.01 A. Therefore, the maximum current through the measurement burden is roughly 0.01 A. If the measurement range of the analog-to-digital converter or other measurement electronics housed within the controller 110 is 5 V, then the burden resistor 182 can be selected to provide a voltage drop of 5 V corresponding to the maximum current through the burden resistor 182. For example, the resistance of the burden resistor 182 can be selected to have a value of 500Ω. While the above values for the resistance of the burden resistor 182 are provided for exemplary purposes, in an actual implementation of the present disclosure the burden resistor 182 can be selected to have a value that maximizes the available range of sensitivity of the measurement electronics in the controller 110. The range of sensitivity of the measurement electronics can be influenced by, for example, the available range of an analogto-digital converter in the controller 110. In an implementation, the value selected for the burden resistor 182 can be roughly inversely proportional to the winding ratio of the CT. In an implementation, the selection of a resistance value for the burden resistor 182 can also be influenced by voltage drops of diodes within the rectifier 172 and by the cutoff frequency of the low pass filter. In an implementation, the resistance of the burden resistor 182 can be adjusted to ensure that the actual peak voltage transmitted on the measurement output 188 corresponds to a maximum measurable voltage by the measurement electronics in the controller 110.

The measurement circuit 100" also includes the diode 193 for preventing current backflow during times when the switch 190 is closed. The operation of the controller 110 to operate the switch 190 to receive the properly referenced measurement signal transmitted by the measurement output 188, detect a fault condition based on the measurement signal, and determine whether to issue the trip signal 151 is similar to the descriptions above provided in connection with FIGS. 1A and 1B.

Figure 2:
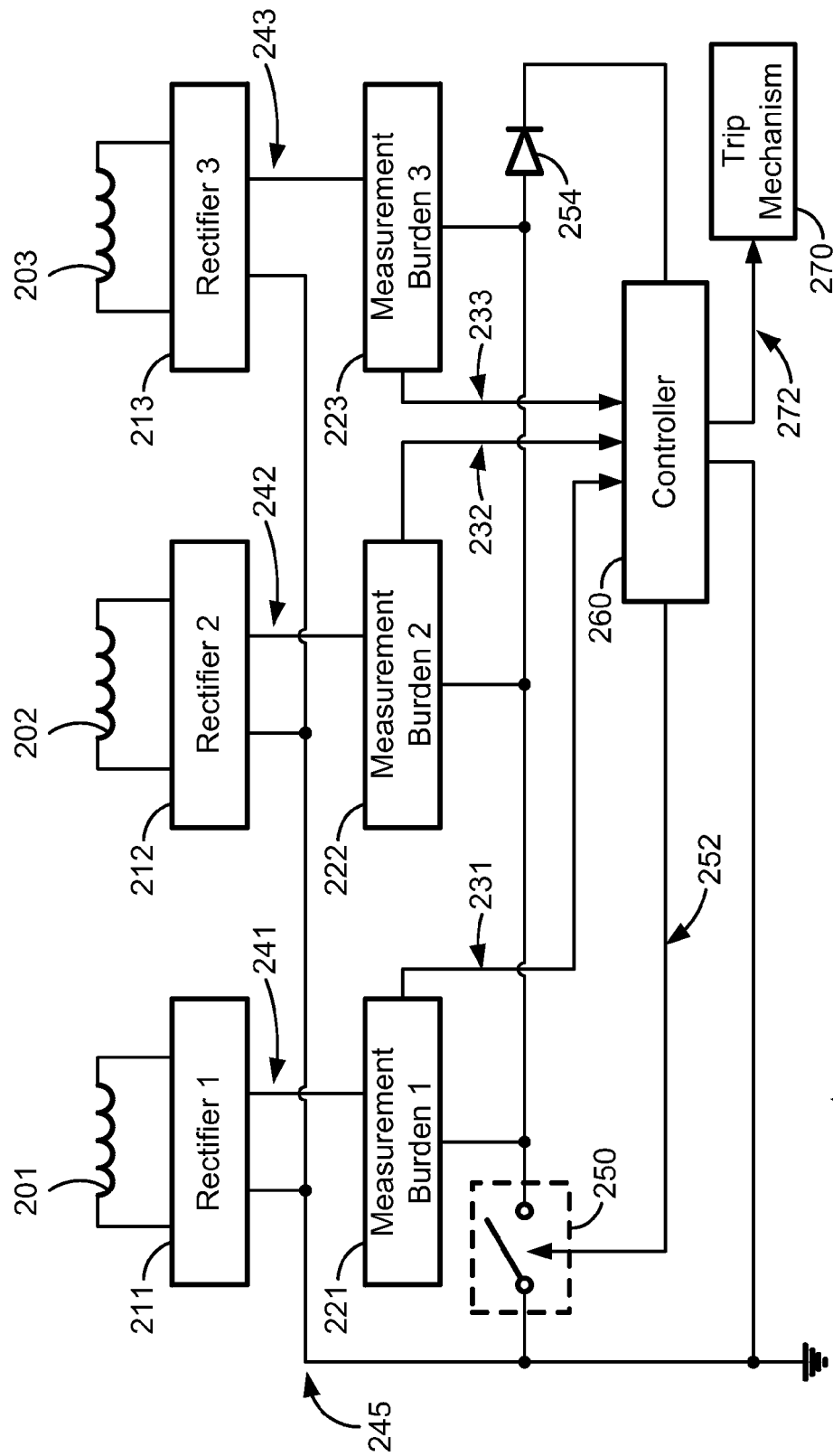
FIG. 2 is a block diagram of a three-phase measurement circuit for a self-powered electronic protection device.

FIG. 2 is a block diagram of a three-phase measurement circuit 200 for a self-powered electronic protection device. The three-phase measurement circuit 200 can monitor electrical characteristics of each phase of a three-phase power source, such as the power source 130 shown in FIG. 1A. The three-phase measurement circuit 200 includes a first CT secondary winding 201, a second CT secondary winding 202, and a third CT secondary winding 203. The first CT secondary winding 201 is a portion of a first CT having a primary winding carrying current from the first phase current of the power source 130. The second CT secondary winding 202 is a portion of a second CT having a primary winding carrying current from the second phase current of the power source 130. The third CT secondary winding 203 is a portion of a third CT having a primary winding carrying current from the third phase current of the power source 130. The AC current in the first CT secondary winding 201 is rectified in a first rectifier 211. Similarly, the AC current in the second CT secondary winding 202 is rectified in a second rectifier 212 and the AC current in the third CT secondary winding 203 is rectified in a third rectifier 213. The rectifiers 211, 212, 213 can be similar to the rectifier 172' shown in FIG. 1C and can be configured as bridge rectifiers.

The first rectifier 211 has a first cathode 241 connected to a first measurement burden 221. The second rectifier 212 has a second cathode 242 connected to a second measurement burden 222. The third rectifier 213 has a third cathode connected to a third measurement burden 223. The measurement burdens 221, 222, 223 can include resistors to provide voltage drops indicative of an electrical characteristic of the phase currents of the power source 130. The electrical characteristic can be, for example, current or voltage.

The three-phase measurement circuit 200 further includes a controller 260 for controlling a switch 250, for controlling a trip mechanism 270, and for receiving measurement signals indicative of electrical characteristics of the three current phases. The controller 260 can be implemented similarly to the controller 110 described above in connection with FIGS. 1A through 1C. The first measurement burden 221 includes a first measurement output 231 for transmitting a first measurement signal indicative of the electrical characteristic of the first phase current to the controller 260. The second measurement burden 222 includes a second measurement output 232 for transmitting a second measurement signal indicative of the electrical characteristic of the second phase current to the controller 260. The third measurement burden 223 includes a third measurement output 233 for transmitting a third measurement signal indicative of the electrical characteristic of the third phase current to the controller 260. The controller 260 can be configured to analyze the output signals by making comparisons between the signals and with one or more threshold values to determine whether a fault condition has occurred. Furthermore, a fault condition can be determined to occur based on a trend of the measurement signals over time. The trip mechanism 270 can be similar to the trip mechanism 150 shown in FIGS. 1A through 1C, and can be configured to operate according to a trip signal 272 issued by the controller 260.

In an example operation of the three-phase measurement circuit 200, the CT secondary windings 201, 202, 203 are energized and the rectifiers 211, 212, 213 provide a DC power supply through the cathodes 241, 242, 243 and the common anode 245. The cathodes are each connected to measurement burdens 221, 222, 223. When the controller 260 closes the switch 250 by issuing the switch signal 252, the measurement burdens 221, 222, 223 provide properly referenced voltage drops indicative of an electrical characteristic of multiple phases of the power supply 130. The controller 260 can close the switch whenever measurements are received from the measurement outputs 231, 232, 233. The diode 254 prevents current from flowing backward from the controller 260 during times when the switch 250 is closed. The controller 260 analyzes the measurement signals transmitted by the measurement outputs 231, 232, 233 to detect a fault condition and determines whether to actuate the trip mechanism 270. The controller 260 can, for example, determine to actuate the trip mechanism 270 when a fault condition is detected, and can actuate the trip mechanism 270 by issuing the trip signal 272.

Aspects of the present disclosure provide a measurement circuit for simultaneously measuring multiple current phases of a power source without incurring additional cost and current consumption required by an inverting or difference amplifier to condition the measurement signals. Aspects of the present disclosure provide for separately measuring multiple current phases of a power source to detect phase loss and phase imbalance fault events without inferring characteristics of multiple phases from a measurement signal representing the sum of multiple phase currents. Aspects of the present disclosure provide for improved sensitivity and performance of an electronic protection device without suffering from additional cost and current consumption penalties.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A circuit for measuring current from a secondary winding of a current transformer through a rectifier having an anode and a cathode, the circuit comprising:
   a measurement burden connected to the cathode of the rectifier, the anode of the rectifier being connected to a reference potential;
   a measurement output configured to transmit an output signal indicative of a voltage across the measurement burden;
   a switch configured to reference the measurement burden to the reference potential, the switch being further configured to be operated according to a control signal; and
   a controller configured to operate the switch using the control signal and to receive the output signal from the measurement output as an indication of the current flowing through the current transformer, the measurement output being operable to transmit the output signal to the controller when the switch is open.

2. The circuit of claim 1, wherein the circuit is further configured to measure current from a secondary winding of a second current transformer through a second rectifier having an anode and a cathode, the circuit further comprising:
a second measurement burden connected to the cathode of the second rectifier, the anode of the second rectifier being connected to the reference potential; and
a second measurement output configured to transmit a second output signal indicative of a voltage across the second measurement burden,
wherein the controller is further configured to receive the second output signal from the second measurement output as an indication of the current flowing through the second current transformer.

3. The circuit of claim 2, wherein the circuit is further configured to measure current from a secondary winding of a third current transformer through a third rectifier having an anode and a cathode, the circuit further comprising:
a third measurement burden connected to the cathode of the third rectifier, the anode of the third rectifier being connected to the reference potential; and
a third measurement output configured to transmit a third output signal indicative of a voltage across the third measurement burden,
wherein the controller is further configured to receive the third output signal from the third measurement output as an indication of the current flowing through the third current transformer.

4. The circuit of claim 3, wherein the switch is further configured to reference the second measurement burden to the reference potential and the third measurement burden to the reference potential.

5. The system of claim 1, wherein the measurement burden includes a burden resistor.

6. The circuit of claim 5, wherein the measurement burden further includes a second resistor and a capacitor connected in series, the second resistor and the capacitor being connected in parallel with the burden resistor to form a low pass filter.

7. The circuit of claim 1, wherein the measurement burden is connected between the cathode and the switch.

8. The circuit of claim 1, wherein the circuit does not include an inverting amplifier.

9. The circuit of claim 1, wherein the output signal is not conditioned by an inverting amplifier or a difference amplifier.

10. The circuit of claim 1, wherein the circuit is incorporated in a self-powered solid state overload relay.

11. A three-phase measurement circuit for measuring: an electrical characteristic from a first secondary winding of a first current transformer through a first rectifier having an anode and a cathode, an electrical characteristic from a second secondary winding of a second current transformer through a second rectifier having an anode and a cathode, and an electrical characteristic from a third secondary winding of a third current transformer through a third rectifier having an anode and a cathode, the circuit comprising:
a first measurement burden connected to the cathode of the first rectifier, the anode of the first rectifier being connected to a reference potential;
a second measurement burden connected to the cathode of the second rectifier, the anode of the second rectifier being connected to the reference potential;
a third measurement burden connected to the cathode of the third rectifier, the anode of the third rectifier being connected to the reference potential;
a first measurement output configured to transmit a first output signal indicative of a voltage across the first measurement burden;
a second measurement output configured to transmit a second output signal indicative of a voltage across the second measurement burden;
a third measurement output configured to transmit a third output signal indicative of a voltage across the third measurement burden;
a switch configured to reference the first measurement burden, the second measurement burden, and the third measurement burden to a reference potential, the switch being further configured to be operated according to a control signal; and
a controller configured to operate the switch using the control signal and to receive, when the switch is open, the first output signal from the first measurement output as an indication of the current flowing through the first current transformer, the second output signal from the second measurement output as an indication of the current flowing through the second current transformer, and the third output signal from the third measurement output as an indication of the current flowing through the third current transformer.

12. The three-phase measurement circuit of claim 11, wherein the controller is configured to actuate a trip mechanism responsive to an imbalance between the measured current flowing through the first current transformer, the measured current flowing through the second current transformer, and the measured current flowing through the third current transformer, the trip mechanism being configured to cause a load to disconnect from the polyphase AC power source responsive to being actuated.

13. The three-phase measurement circuit of claim 11, wherein the controller is configured to actuate a trip mechanism responsive to: the first output signal, the second output signal, or the third output signal being below a threshold value, the trip mechanism being configured to cause a load to disconnect from the polyphase AC power source responsive to being actuated.

14. The three-phase measurement circuit of claim 11, wherein the first measurement burden includes a low pass filter, the second measurement burden includes a low pass filter, and the third measurement burden includes a low pass filter.

15. The three-phase measurement circuit of claim 11,
wherein the first measurement burden includes a first burden resistor having a first terminal and a second terminal, the first terminal being connected to the cathode of the first rectifier, the second terminal being connected to the switch,
wherein the second measurement burden includes a second burden resistor having a first terminal and a second terminal, the first terminal being connected to the cathode of the second rectifier, the second terminal being connected to the switch, and
wherein the third measurement burden includes a third burden resistor having a first terminal and a second terminal, the first terminal being connected to the cathode of the third rectifier, the second terminal being connected to the switch.

16. The three-phase measurement circuit of claim 15, wherein the first measurement burden further includes:

a first filter resistor having a first terminal and a second terminal, the first terminal of the first filter resistor being connected to the first terminal of the first burden resistor, and a first filter capacitor having a first terminal and a second terminal, the first terminal of the first filter capacitor being connected to the second terminal of the first filter resistor and the first measurement output, the second terminal of the first filter capacitor being connected to the second terminal of the first burden resistor;

wherein the second measurement burden further includes:

a second filter resistor having a first terminal and a second terminal, the first terminal of the second filter resistor being connected to the first terminal of the second burden resistor, and a second filter capacitor having a first terminal and a second terminal, the first terminal of the second filter capacitor being connected to the second terminal of the second filter resistor and the second measurement output, the second terminal of the second filter capacitor being connected to the second terminal of the second burden resistor; and wherein the third measurement burden further includes:

a third filter resistor having a first terminal and a second terminal, the first terminal of the third filter resistor being connected to the first terminal of the third burden resistor, and a third filter capacitor having a first terminal and a second terminal, the first terminal of the third filter capacitor being connected to the second terminal of the third filter resistor and the third measurement output, the second terminal of the third filter capacitor being connected to the second terminal of the third burden resistor.

17. The three-phase measurement circuit of claim 11, wherein the first output signal, the second output signal, and the third output signal are not conditioned by an inverting amplifier or a difference amplifier.

18. The three-phase measurement circuit of claim 11, wherein the circuit is self-powered.

19. The three-phase measurement circuit of claim 11, wherein the circuit is incorporated in a self-powered solid state overload relay.

20. A method of measuring a current flowing through a secondary winding of a current transformer, the secondary winding of the current transformer being connected to a rectifier having a cathode and an anode, a measurement burden being connected to the cathode of the rectifier, the method comprising:

closing a switch connected between a reference potential and the measurement burden for referencing a voltage drop across the measurement burden to the reference potential, the voltage drop across the measurement burden being indicative of the current flowing through the secondary winding; and receiving an output signal indicative of the voltage drop across the measurement burden while the switch is open;

receiving an output signal indicative of the voltage drop across the measurement burden while the switch is closed.

* * * * *